(12) United States Patent
Yang et al.

(10) Patent No.: US 11,936,375 B2
(45) Date of Patent: Mar. 19, 2024

(54) BUFFER APPARATUS, CHIP AND ELECTRONIC DEVICE

(71) Applicant: Chipone Technology (Beijing) Co., LTD., Beijing (CN)

(72) Inventors: Wei Yang, Beijing (CN); Lei Fan, Beijing (CN)

(73) Assignee: Chipone Technology (Beijing) Co., LTD., Beijing (CN)

( * ) Notice: Subject to any disclaimer, the term of this patent is extended or adjusted under 35 U.S.C. 154(b) by 0 days.

(21) Appl. No.: 17/730,157

(22) Filed: Apr. 26, 2022

(65) Prior Publication Data

US 2022/0255547 A1 Aug. 11, 2022

Related U.S. Application Data

(63) Continuation of application No. PCT/CN2020/132737, filed on Nov. 30, 2020.

(30) Foreign Application Priority Data

Dec. 9, 2019 (CN) .......................... 201922195113.2

(51) Int. Cl.
*H03K 17/687* (2006.01)
*H03K 5/01* (2006.01)

(52) U.S. Cl.
CPC ........... *H03K 17/6872* (2013.01); *H03K 5/01* (2013.01)

(58) Field of Classification Search
CPC ................. H03K 17/6872; H03K 5/01; H03K 19/00384; H03K 19/018521;
(Continued)

(56) References Cited

U.S. PATENT DOCUMENTS

2007/0014177 A1\* 1/2007 Jeong ..................... G11C 5/143
365/226
2016/0049925 A1 2/2016 Chaung

FOREIGN PATENT DOCUMENTS

CN 101043215 A 9/2007
CN 101282114 A 10/2008
(Continued)

OTHER PUBLICATIONS

Office Action dated Jun. 27, 2023 in the corresponding application No. JP 2022-527885.

*Primary Examiner* — Jung Kim
(74) *Attorney, Agent, or Firm* — Butzel Long

(57) ABSTRACT

A buffer apparatus, a chip and an electronic device. The apparatus comprises: a voltage adjustment module (10) comprising a first P-type metal-oxide-semiconductor field-effect transistor (PMOS), wherein the voltage adjustment module (10) is used for receiving an input voltage, using a threshold voltage for the first PMOS to adjust the input voltage, and outputting a driving voltage; and a buffer module (20) electrically connected to the voltage adjustment module (10) and used for receiving an input signal, buffering the input signal under the driving voltage, and outputting a buffered signal. The driving voltage obtained by using the threshold voltage for the first PMOS to adjust the input voltage can compensate for a process corner of the buffer module (20), such that the range of a flip point voltage of the buffer module (20) becomes small and meets process requirements.

5 Claims, 2 Drawing Sheets

(58) Field of Classification Search
CPC .......... H03K 19/00369; H03K 17/6874; G05F 1/575; G05F 3/242; H03F 3/45475
See application file for complete search history.

(56) References Cited

FOREIGN PATENT DOCUMENTS

| | | |
|---|---|---|
| CN | 103066971 A | 4/2013 |
| CN | 108398978 A | 8/2018 |
| CN | 109036322 A | 12/2018 |
| CN | 210899134 U | 6/2020 |
| JP | 02000350 A | 1/1990 |
| JP | 06131068 A | 5/1994 |
| JP | 10154924 A | 6/1998 |
| JP | 2001067872 A | 3/2001 |
| JP | 2011055459 A | 3/2011 |
| WO | 2018088373 A1 | 10/2019 |

\* cited by examiner

US 11,936,375 B2

BUFFER APPARATUS, CHIP AND ELECTRONIC DEVICE

The present application is a continuation of and claims priority under 35 U.S.C. 120 to PCT Application. No. PCT/CN2020/132737, filed on Nov. 30, 2020, which claims priority to Chinese Patent Application No. 201922195113.2, filed with the CNIPA on Dec. 9, 2019, and entitled "Buffer Apparatus, Chip and Electronic Device". All the above-referenced priority documents are incorporated herein by reference in their entirety.

TECHNICAL FIELD

The present disclosure relates to the technical field of integrated circuits, and in particular to a buffer apparatus, a chip, and an electronic device.

BACKGROUND

With the continuous development of integrated circuit technology, digital buffers are increasingly used. In related arts, Schmitt trigger circuits are generally used to implement digital buffers, so as to guarantee a low latency. However, because the digital buffer is powered directly by the supply voltage, and the transistors forming the digital buffer are technically defective, the trigger point voltage may vary in a wide range and cannot meet requirements.

SUMMARY

Technical Problem

In view of the above, the technical problem to be solved by the present disclosure is how to narrow the range in which the trigger point voltage of the buffer apparatus varies.

Solution to Problem

In order to address the above-mentioned technical problem, according to one embodiment of the present disclosure, there is provided a buffer apparatus, including:
  a voltage adjustment module comprising a first P-type metal-oxide-semiconductor field-effect transistor (PMOS), wherein the voltage adjustment module is configured to receive an input voltage, adjust the input voltage with a threshold voltage for the first PMOS, and output a drive voltage; and
  a buffer module electrically connected to the voltage adjustment module, and configured to receive an input signal, buffer the input signal at the drive voltage, and output a buffered signal.

Regarding the above-mentioned apparatus, in a possible implementation, the voltage adjustment module further comprises a first current source, a first N-type metal-oxide-semiconductor field-effect transistor (NOMS), a first resistor, a second resistor, a third resistor, a fourth resistor, and a first capacitor, wherein,
  a positive electrode of the first current source is electrically connected to a first terminal of the third resistor to receive the input voltage, and a negative electrode of the first current source is electrically connected to a source of the first PMOS, a gate of the first NMOS, and a first terminal of the first capacitor, wherein the input voltage is a supply voltage,
  a gate of the first PMOS is electrically connected to a drain of the first PMOS and a first terminal of the first resistor, and a second terminal of the first resistor is electrically connected to a first terminal of the second resistor,
  a second terminal of the third resistor is electrically connected to a drain of the first NMOS,
  a source of the first NMOS is electrically connected to a first terminal of the fourth resistor and the buffer module to output the drive voltage, and
  a second terminal of the second resistor, a second terminal of the first capacitor, and a second terminal of the fourth resistor are grounded.

Regarding the above-mentioned apparatus, in a possible implementation, the voltage adjustment module further comprises a second current source, a second NOMS, a fifth resistor, a sixth resistor, a seventh resistor, and a second capacitor, wherein,
  a positive electrode of the second current source is electrically connected to a first terminal of the sixth resistor to receive a supply voltage, and a negative electrode of the second current source is electrically connected to a source of the first PMOS, a gate of the second NMOS, and a first terminal of the second capacitor,
  a gate of the first PMOS is configured to receive the input voltage, and a drain of the first PMOS is electrically connected to a first terminal of the fifth resistor,
  a second terminal of the sixth resistor is electrically connected to a drain of the second NMOS,
  a source of the second NMOS is electrically connected to a first terminal of the seventh resistor and the buffer module to output the drive voltage, and
  a second terminal of the fifth resistor, a second terminal of the second capacitor, and a second terminal of the seventh resistor are grounded.

Regarding the above-mentioned apparatus, in a possible implementation, the voltage adjustment module further comprises a first operational amplifier, an eighth resistor, a ninth resistor, and a tenth resistor, wherein
  a positive input of the first operational amplifier is configured to receive the input voltage, and an output of the first operational amplifier is electrically connected to a source of the first PMOS and the buffer module to output the drive voltage,
  a drain of the first PMOS is electrically connected to a gate of the first PMOS and a first terminal of the eighth resistor, a second terminal of the eighth resistor is electrically connected to a first terminal of the ninth resistor, a second terminal of the ninth resistor is electrically connected to a first terminal of the tenth resistor, and a second terminal of the tenth resistor is grounded, and
  a negative input of the first operational amplifier is electrically connected to the second terminal of the eighth resistor and the first terminal of the ninth resistor.

Regarding the above-mentioned apparatus, in a possible implementation, the voltage adjustment module further comprises a second operational amplifier, a third operational amplifier, a second PMOS, a third NMOS, a fourth NMOS, an eleventh resistor, a twelfth resistor, a thirteenth resistor, and a third current source, wherein,
  a source of the first PMOS is electrically connected to a first terminal of the eleventh resistor to receive a supply voltage, and a drain of the first PMOS is electrically connected to a positive electrode of the third current source, a gate of the first PMOS, and a positive input of the second operational amplifier, a negative input of the second operational amplifier is electrically connected to a second terminal of the eleventh resistor and a source of the second PMOS, and an output of the second operational amplifier is electrically connected to a gate of the second PMOS, a drain of the second PMOS is electrically connected to a drain of the third NMOS, a gate of the third NMOS, and a gate of the fourth NMOS, a drain of the fourth NMOS is electrically connected to a negative input of the third operational amplifier, a second terminal of the twelfth resistor, and a first terminal of the thirteenth resistor, a positive input of the third operational amplifier is configured to receive the input voltage, and an output of the third operational amplifier is electrically connected to a first terminal of the twelfth resistor and the buffer module to output the drive voltage, and a negative electrode of the third current source, a source of the third NMOS, a source of the fourth NMOS, and a second terminal of the thirteenth resistor are grounded.

Regarding the above-mentioned apparatus, in a possible implementation, the buffer module comprises a third PMOS, a fourth PMOS, a fifth PMOS, a fifth NMOS, a sixth NMOS, a seventh NMOS, and an inverter, wherein a source of the third PMOS is electrically connected to a source of the fifth PMOS, to input a supply voltage, a gate of the third PMOS is electrically connected to a gate of the fourth PMOS, a gate of the fifth NMOS, and a gate of the sixth NMOS, to receive the input signal, a drain of the third PMOS is electrically connected to a drain of the fifth PMOS and a source of the fourth PMOS, a drain of the fourth PMOS is electrically connected to an input of the inverter and a drain of the fifth NMOS, a source of the fifth NMOS is electrically connected to a drain of the sixth NMOS and a drain of the seventh NMOS, and a source of the sixth NMOS and a source of the seventh NMOS are grounded, and an output of the inverter is electrically connected to a gate of the fifth PMOS and a gate of the seventh NMOS, to output the buffered signal.

Regarding the above-mentioned apparatus, in a possible implementation, the apparatus is applicable to an electronic circuit apparatus including any one of an analog-to-digital conversion circuit, a power-on reset circuit, an ultrasonic sensor circuit, an electronic switching circuit, a signal switching control circuit, an IGBT drive and control circuit, a current threshold detection circuit, a voltage threshold detection circuit, and a photoelectric sensing circuit.

In order to address the above-mentioned technical problem, according to another embodiment of the present disclosure, there is provided a chip, comprising:

the buffer apparatus.

In order to address the above-mentioned technical problem, according to another embodiment of the present disclosure, there is provided an electronic device, comprising:

the chip.

Beneficial Effects

The voltage adjustment module in the buffer apparatus proposed in the embodiments of the present disclosure can adjust the input voltage based on the threshold voltage for the first PMOS, and the resulting drive voltage can compensate for the process corner of the buffer module, such that the range of the trigger point voltage of the buffer module becomes smaller so as to meet the process requirements.

Additional features and aspects of the present disclosure will become apparent from the following detailed description of exemplary embodiments with reference to the attached drawings.

BRIEF DESCRIPTION OF THE DRAWINGS

The drawings, which are incorporated in and constitute part of the specification, illustrate exemplary embodiments, features and aspects of the present disclosure and be used to explain the principle of the present disclosure together with the specification.

DETAILED DESCRIPTION

Figure 1:
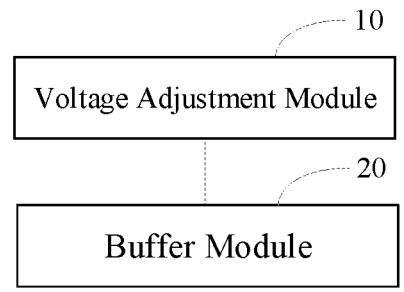
FIG. 1 shows a block diagram for a buffer apparatus according to one embodiment of the present disclosure.

Various exemplary embodiments, features and aspects of the present disclosure will be described in detail with reference to the drawings. The same reference numerals in the drawings represent parts having the same or similar functions. Although various aspects of the embodiments are shown in the drawings, it is unnecessary to proportionally draw the drawings unless otherwise specified.

Herein the specific term "exemplary" means "used as an example, or embodiment, or explanatory". An "exemplary" embodiment given here is not necessarily construed as being superior to or better than other embodiments.

In addition, numerous details are given in the following specific embodiments for the purpose of better explaining the present disclosure. It should be understood by a person skilled in the art that the present disclosure can still be realized even without some of those details. In some of the examples, methods, means, units and circuits that are well known to a person skilled in the art are not described in detail so that the principle of the present disclosure becomes apparent.

Referring to FIG. 1, it shows a block diagram for a buffer apparatus according to one embodiment of the present disclosure.

As shown in FIG. 1, the apparatus includes:

a voltage adjustment module 10 including a first P-type metal-oxide-semiconductor field-effect transistor PMOS (not shown in FIG. 1), where the voltage adjustment module 10 is configured to receive an input voltage, and adjust the input voltage based on a threshold voltage for the first PMOS to output a drive voltage; and a buffer module 20 electrically connected to the voltage adjustment module 10, and configured to receive an input signal, and buffer the input signal under the drive voltage to output the buffered signal.

The voltage adjustment module in the buffer apparatus proposed in the embodiment of the present disclosure can adjust the input voltage based on the threshold voltage for the first PMOS, and the resulting drive voltage can compensate for the process corner of the buffer module, such that the range of the trigger point voltage of the buffer module becomes smaller so as to meet the process requirements.

The apparatus in the embodiments of the present disclosure can be disposed in an electronic device. The electronic device may also be referred to as a mobile device. The mobile device may refer to various forms of an access mobile device, a user unit, user equipment, a subscriber station, a mobile station, a Mobile Station (MS), a remote station, a remote mobile device, a mobile device, a user mobile device, terminal equipment, wireless communication equipment, a user agent, or a user device. The user equipment may also be a cell phone, a cordless phone, a Session Initiation Protocol (SIP) phone, a Wireless Local Loop (WLL) station, a Personal Digital Assistant (PDA), a handheld apparatus with wireless communication functions, a computing apparatus, or other processing apparatuses connected to a wireless modem, an in-vehicle apparatus, a wearable apparatus, user equipment used in 5G networks, or a mobile device used in evolved Public Land Mobile Network (PLMN) in the future, etc. The present embodiments are not limited thereto.

The buffer apparatus of the embodiment of the present disclosure can be applied to any apparatus/device inputted with a digital signal and required to perform a buffer process, which includes, but is not limited to, the electronic circuit apparatus formed by any one of an analog-to-digital conversion circuit, a power-on reset circuit, an ultrasonic sensor circuit, an electronic switching circuit, a signal switching control circuit, an IGBT drive and control circuit, a current threshold detection circuit, a voltage threshold detection circuit, and a photoelectric sensing circuit.

The buffer module 20 may be implemented in many implementations. Here is an exemplary illustration of a possible implementation of the buffer module 20.

Figure 2:
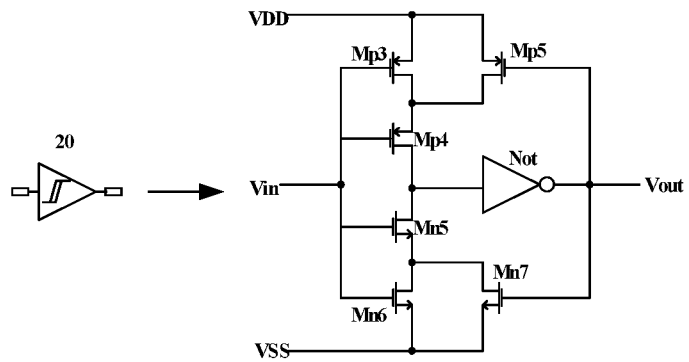
FIG. 2 shows a schematic diagram for a buffer module according to one embodiment of the present disclosure.

Referring to FIG. 2, it shows a schematic diagram for a buffer module according to one embodiment of the present disclosure.

In a possible implementation, as shown in FIG. 2, the buffer module 20 may include a third PMOS Mp3, a fourth PMOS Mp4, a fifth PMOS Mp5, a fifth NMOS Mn5, a sixth NMOS Mn6, a seventh NMOS Mn7, and an inverter Not, where:

a source of the third PMOS Mp3 is electrically connected to a source of the fifth PMOS Mp5 and configured to input a supply voltage VDD, a gate of the third PMOS Mp3 is electrically connected to a gate of the fourth PMOS Mp4, a gate of the fifth NMOS Mn5, and a gate of the sixth NMOS Mn6, and configured to receive the input signal Vin, a drain of the third PMOS Mp3 is electrically connected to a drain of the fifth PMOS Mp5 and a source of the fourth PMOS Mp4, a drain of the fourth PMOS Mp4 is electrically connected to an input of the inverter Not and a drain of the fifth NMOS Mn5, a source of the fifth NMOS Mn5 is electrically connected to a drain of the sixth NMOS Mn6 and a drain of the seventh NMOS Mn7, and a source of the sixth NMOS Mn6 and a source of the seventh NMOS Mn7 are grounded, and an output of the inverter Not is electrically connected to a gate of the fifth PMOS Mp5 and a gate of the seventh NMOS Mn7, and configured to output the buffered signal Vout.

The fifth PMOS Mp5 and the seventh NMOS Mn7 can realize, by feedback, certain hysteresis between a logic-high level and a logic-low level, to prevent occurrence of burrs caused by repeated switches between the high and low levels in the vicinity of the trigger point voltage.

It should be noted that the above-mentioned description of the buffer module 20 is exemplary, and a person skilled in the art can implement the buffer module 20 in other manners.

The trigger point voltage of the buffer module 20 will be illustrated below.

Assume the third PMOS Mp3 and the fourth PMOS Mp4 are the same (for convenience, PMOS Mp will be used for explanation), the fifth NMOS Mn5 and the sixth NMOS Mn6 are the same (for convenience, NMOS Mn will be used for explanation), and the fifth PMOS Mp5 and the seventh NMOS Mn7 configured to generate hysteresis voltages are omitted. Assume the trigger point voltage is $V_{INV}$, the absolute value of the threshold voltage for the PMOS Mp is $VT_P$, and the threshold voltage for the NMOS Mn is $VT_N$. If $$\beta_P = \mu_P C_{OX} \frac{W_P}{L_P}, \beta_N = \mu_N C_{OX} \frac{W_N}{L_N}, r = \frac{\beta_P}{\beta_N},$$

where $C_{OX}$ represents a gate capacitance per unit area of the transistor, $W_P$ and $W_N$ represent the width of PMOS or NMOS respectively, $L_P$ and $L_N$ represents the length of PMOS or NMOS respectively, and $\mu_P$ and $\mu_N$ represent the mobility of PMOS or NMOS respectively, it is possible to derive the following equation from $$\frac{\beta_N}{2}(V_{INV} - V_{TN})^2 = \frac{\beta_P}{2}(VDD - V_{INV} - V_{TP})^2$$

at the trigger point of the voltage:

$$V_{INV} = \frac{VDD + V_{TN}\sqrt{\frac{1}{r}} - V_{TP}}{1 + \sqrt{\frac{1}{r}}}. \qquad \text{equation 1}$$

As can be appreciated from equation 1, the trigger point voltage $V_{INV}$ of the buffer module 20 is related to the supply voltage VDD, the dimensions of NMOS and PMOS, and the threshold voltages for NMOS and PMOS.

As can be appreciated from equation 1, when the supply voltage VDD is unchanged, the SNFP (Slow Nmos Fast Pmos) in the process corner is the worst process corner of the logic-high, which determines whether the buffer module can achieve the minimum value of the logic-high being 1.2 or 1.1 or 1.05; the FNSP (Fast Nmos Slow Pmos) in the process corner is the worst process corner of the logic-low, which determines whether the buffer module can achieve the maximum value of the logic-low being 0.6V. Therefore, the SNFP and FNSP determine the range of the trigger point voltage of the buffer module 20. The analysis is detailed as follows:

For the TT process corner in the process corner, suppose $VT_N=VT_P=VT$; for the SS process corner in the process corner, suppose $VT_N=VTP=VT+\Delta$; for the FF process corner in the process corner, suppose $VT_N=VT_P=VT-\Delta$, where $\Delta$ may represent a preset value. It should be noted that the present disclosure does not limit the specific value of $\Delta$, and a person skilled in the art can set it as appropriate.

In light of the above hypotheses and based on the equation 1, it is possible to obtain:

for the TT process corner:
$$V_{INV} = \frac{VDD+V_{TN}\sqrt{\frac{1}{r}}-V_{TP}}{1+\sqrt{\frac{1}{r}}} = \frac{VDD+VT\left(\sqrt{\frac{1}{r}}-1\right)}{1+\sqrt{\frac{1}{r}}},$$

for the SS process corner:
$$V_{INV} = \frac{VDD+V_{TN}\sqrt{\frac{1}{r}}-V_{TP}}{1+\sqrt{\frac{1}{r}}} = \frac{VDD+VT\left(\sqrt{\frac{1}{r}}-1\right)+\Delta\left(\sqrt{\frac{1}{r}}-1\right)}{1+\sqrt{\frac{1}{r}}},$$

for the FF process corner:
$$V_{INV} = \frac{VDD+V_{TN}\sqrt{\frac{1}{r}}-V_{TP}}{1+\sqrt{\frac{1}{r}}} = \frac{VDD+VT\left(\sqrt{\frac{1}{r}}-1\right)-\Delta\left(\sqrt{\frac{1}{r}}-1\right)}{1+\sqrt{\frac{1}{r}}},$$

for the SNFP process corner:
$$V_{INV} = \frac{VDD+V_{TN}\sqrt{\frac{1}{r}}-V_{TP}}{1+\sqrt{\frac{1}{r}}} = \frac{VDD+VT\left(\sqrt{\frac{1}{r}}-1\right)+\Delta\left(\sqrt{\frac{1}{r}}+1\right)}{1+\sqrt{\frac{1}{r}}},$$

for the FNSP process corner:
$$V_{INV} = \frac{VDD+V_{TN}\sqrt{\frac{1}{r}}-V_{TP}}{1+\sqrt{\frac{1}{r}}} = \frac{VDD+VT\left(\sqrt{\frac{1}{r}}-1\right)-\Delta\left(\sqrt{\frac{1}{r}}+1\right)}{1+\sqrt{\frac{1}{r}}}.$$

In the above equations, the SNFP is the maximum value among a plurality of process corners, and is the worst process corner of the logic-high, which determines whether the buffer module can achieve the minimum value of the logic-high being 1.2 or 1.1 or 1.05; the FNSP is the minimum value among a plurality of process corners, and is the worst process corner of the logic-low, which determines whether the buffer module can achieve the maximum value of the logic-low being 0.6V.

In general, the supply voltage VDD is in a range from 2.5V to 5.5V. If the buffer module 20 is powered directly by the supply voltage VDD, since the trigger point voltage of the digital buffer 20 is related to the supply voltage VDD, the dimensions of NMOS and PMOS, and the threshold voltages for NMOS and PMOS, the maximum value of the logic-low at the trigger point voltage of the buffer module is 0.6V, and the minimum value of the logic-high is 2.0V. As shown above, the range of the trigger point voltage is relatively broad (the difference between logic-high and logic-low is greater than 1V). If it is desirable to narrow the range of the trigger point voltage, e.g., to realize that the difference between the logic-high and the logic-low is less than or equal to 0.6V (for example, the maximum value of logic-low is 0.6, and the minimum value of logic-high is 1.2 or 1.1 or 1.05), there is a need to disassociate the trigger point voltage from the supply voltage VDD, the dimensions of NMOS and PMOS, and the threshold voltages for NMOS and PMOS.

The embodiment of the present disclosure can remove the dependency of the buffer module on the supply voltage, reduce the influence of the supply voltage, and eliminate the influence of the threshold voltage, so that the SNFP and FNSP process corners are changed into the SS and FF process corners, thereby narrowing the range of the trigger point voltage.

Here is an illustrative description of possible implementations of the voltage adjustment module 10.

Figure 3:
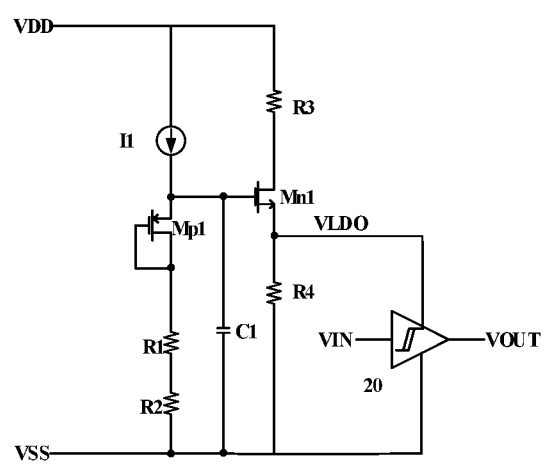
FIG. 3 shows a schematic diagram for a voltage adjustment module according to one embodiment of the present disclosure.

Referring to FIG. 3, it shows a schematic diagram for a voltage adjustment module according to one embodiment of the present disclosure.

In a possible implementation, as shown in FIG. 3, the voltage adjustment module 10 may include a first current source I1, a first N-type metal-oxide-semiconductor field-effect transistor NOMS Mn1, a first resistor R1, a second resistor R2, a third resistor R3, a fourth resistor R4, and a first capacitor C1, where:

a positive electrode of the first current source I1 is electrically connected to a first terminal of the third resistor R3 and configured to receive the input voltage, and a negative electrode of the first current source I1 is electrically connected to a source of the first PMOS Mp1, a gate of the first NMOS Mn1, and a first terminal of the first capacitor C1, where the input voltage is a supply voltage VDD, a gate of the first PMOS Mp1 is electrically connected to a drain of the first PMOS Mp1 and a first terminal of the first resistor R1, and a second terminal of the first resistor R1 is electrically connected to a first terminal of the second resistor R2, a second terminal of the third resistor R3 is electrically connected to a drain of the first NMOS Mn1, a source of the first NMOS Mn1 is electrically connected to a first terminal of the fourth resistor R4 and the buffer module, and configured to output the drive voltage VLDO, and all of a second terminal of the second resistor R2, a second terminal of the first capacitor C1, and a second terminal of the fourth resistor R4 are grounded.

In one example, if the first current source I1 is Vbg/R (where Vbg is a reference voltage, the magnitude of which is stable) and flows through the first resistor R1, the second resistor R2, and the first PMOS Mp1, VLDO=I1*(R1+R2)+Vgsp−Vgsn1, where Vgsp represents a gate-to-source voltage of the first PMOS Mp1, and Vgsn1 represents a gate-to-source voltage of the first NMOS Mn1.

In one example, the first PMOS Mp1 and the first NMOS Mn1 can be selected appropriately, such that the overdrive voltages of the first PMOS Mp1 and the first NMOS Mn1 are approximately equal, e.g., Vov1. In this situation, Vgsp=VTP+Vov1, and Vgsn1=VTN+Vov1. Then, the voltage VLDO is VLDO=I1*(R1+R2)+VTP−VTN=Vbg*(R1+R2)/R+VTP−VTN. Based on the equation 1 showing the trigger point voltage of the buffer module, the following equation can be derived:

$$V_{INV} = \frac{VDD + V_{TN}\sqrt{\frac{1}{r}} - V_{TP}}{1 + \sqrt{\frac{1}{r}}} = \frac{Vbg(R1+R2)/R + V_{TN}\left(\sqrt{\frac{1}{r}} - 1\right)}{1 + \sqrt{\frac{1}{r}}}.$$

It should be noted that the threshold voltage for each PMOS can be considered identical on the same piece of wafer, so can be the threshold voltage for each NMOS. Therefore, the first PMOS Mp1 can be introduced to offset the impact of the threshold voltage for the PMOS in the buffer module 20 on the trigger point voltage.

It can thus be seen from the above equation that $V_{INV}$ is not affected by the supply voltage VDD, but it is related to the current source (i.e., related to the voltage Vbg). The voltage Vbg may be a reference voltage, so it can remain stable without being affected by the process corner. It can also be seen from the above equation that the influence of the threshold voltage $VT_P$ for PMOS is removed, so the variation of the trigger point voltage $V_{INV}$ in the full process corner range is significantly smaller, and the SNFP and FNSP process corners are changed into the SS and FF process corners.

Figure 4:
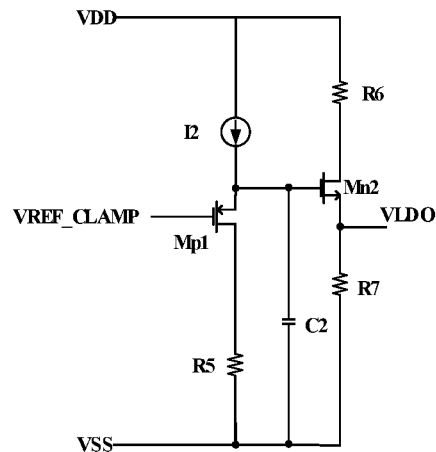
FIG. 4 shows a schematic diagram for a voltage adjustment module according to one embodiment of the present disclosure.

Referring to FIG. 4, it shows a schematic diagram for a voltage adjustment module according to one embodiment of the present disclosure.

In a possible implementation, as shown in FIG. 4, the voltage adjustment module 10 may further include a second current source I2, a second NOMS Mn2, a fifth resistor R5, a sixth resistor R6, a seventh resistor R7, and a second capacitor C2, where:
  a positive electrode of the second current source I2 is electrically connected to a first terminal of the sixth resistor R6 and configured to receive a supply voltage VDD, and a negative electrode of the second current source I2 is electrically connected to a source of the first PMOS Mp1, a gate of the second NMOS Mn2, and a first terminal of the second capacitor C2,
  a gate of the first PMOS Mp1 is configured to receive the input voltage VREF_CLAMP, and a drain of the first PMOS Mp1 is electrically connected to a first terminal of the fifth resistor R5,
  a second terminal of the sixth resistor R6 is electrically connected to a drain of the second NMOS Mn2,
  a source of the second NMOS Mn2 is electrically connected to a first terminal of the seventh resistor R7 and the buffer module 20 (not shown), and configured to output the drive voltage VLDO, and
  all of a second terminal of the fifth resistor R5, a second terminal of the second capacitor C2, and a second terminal of the seventh resistor R7 are grounded.

In one example, as shown in FIG. 4, VLDO=VREF_CLAMP+Vgsp−Vgsn2. The first PMOS Mp1 and the second NMOS Mn2 can be selected appropriately, such that the overdrive voltages of the first PMOS Mp1 and the second NMOS Mn2 are approximately equal, e.g., Vov2. In the above equation, Vgsp represents a gate-to-source voltage of the first PMOS Mp1, and Vgsn2 represents a gate-to-source voltage of the second NMOS Mn2. In this situation, Vgsp=VTP+Vov2, and Vgsn=VTN+Vov2.

Then, the voltage VLDO is VLDO=VREF_CLAMP+VTP−VTN. based on the equation 1, the following equation can be derived:

$$V_{INV} = \frac{VDD + V_{TN}\sqrt{\frac{1}{r}} - V_{TP}}{1 + \sqrt{\frac{1}{r}}} = \frac{VREF\_CLAMP + V_{TN}\left(\sqrt{\frac{1}{r}} - 1\right)}{1 + \sqrt{\frac{1}{r}}}.$$

Therefore, it can be appreciated from the above equation that $V_{INV}$ is not affected by the supply voltage VDD, but it is related to the input voltage VREF_CLAMP. The input voltage VREF_CLAMP may be a reference voltage, so it can remain stable without being affected by the process corner. It can also be appreciated from the above equation that the influence of the threshold voltage $VT_P$ for PMOS is removed, so the variation of the trigger point voltage $V_{INV}$ in the full process corner range is significantly smaller, and the SNFP and FNSP process corners are changed into the SS and FF process corners.

Figure 5:
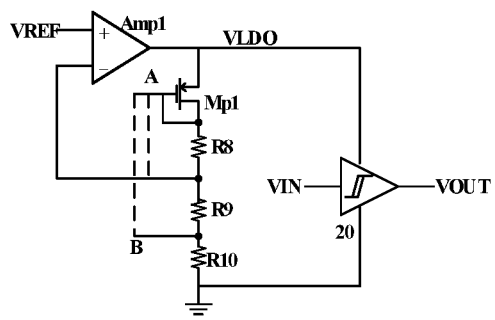
FIG. 5 shows a schematic diagram for a voltage adjustment module according to one embodiment of the present disclosure.

Referring to FIG. 5, it shows a schematic diagram for a voltage adjustment module according to one embodiment of the present disclosure.

In a possible implementation, as shown in FIG. 5, the voltage adjustment module 10 further includes a first operational amplifier Amp1, an eighth resistor R8, a ninth resistor R9, and a tenth resistor R10, where:
  a positive input of the first operational amplifier Amp1 is configured to receive the input voltage VREF, and an output of the first operational amplifier Amp1 is electrically connected to a source of the first PMOS Mp1 and the buffer module 20 and configured to output the drive voltage VLDO,
  a drain of the first PMOS Mp1 is electrically connected to a gate of the first PMOS Mp1 and a first terminal of the eighth resistor R8, a second terminal of the eighth resistor R8 is electrically connected to a first terminal of the ninth resistor R9, a second terminal of the ninth resistor R9 is electrically connected to a first terminal of the tenth resistor R10, and a second terminal of the tenth resistor R10 is grounded, and
  a negative input of the first operational amplifier Amp1 is electrically connected to the second terminal of the eighth resistor R8 and the first terminal of the ninth resistor R9.

In other implementations, as shown in FIG. 5, the gate of the first PMOS Mp1 may also be electrically connected between the eighth resistor R8 and the ninth resistor R9, or the gate of the first PMOS Mp1 may further be electrically connected between the ninth resistor R9 and the tenth resistor R10. By changing the electrical connection relationship between the first PMOS Mp1 and the other circuits, the trigger point voltage can be adjusted. Description will be given below by such an example that the gate of the first PMOS Mp1 is electrically connected to the drain of the first PMOS Mp1 and the first terminal of the eighth resistor.

In one example, as shown in FIG. 5, VLDO=VREF*(R8+R9+R10)/(R9+R10)+Vgsp, where Vgsp represents the gate-to-source voltage of the first PMOS Mp1. If the overdrive voltage of the first PMOS Mp1 is Vov3, VLDO=VREF*(R8+R9+R10)/(R9+R10)+$VT_P$+Vov3. based on the equation 1, the following equation can be derived:

$$V_{INV} = \frac{VDD + V_{TN}\sqrt{\frac{1}{r}} - V_{TP}}{1+\sqrt{\frac{1}{r}}} =$$

$$\frac{VREF^*(R8+R9+R10)/(R9+R10) + V_{TN}\sqrt{\frac{1}{r}} + Vov}{1+\sqrt{\frac{1}{r}}}.$$

Therefore, it can be appreciated from the above equation that the trigger point voltage $V_{INV}$ is not affected by the supply voltage VDD, but it is related to the input voltage VREF. The input voltage VREF may be a reference voltage, so it can remain stable without being affected by the process corner. It can also be appreciated from the above equation that the influence of the threshold voltage $VT_P$ for PMOS is removed, so the variation of the trigger point voltage $V_{INV}$ in the full process corner range is significantly smaller, and the SNFP and FNSP process corners are changed into the SS and FF process corners.

Figure 6:
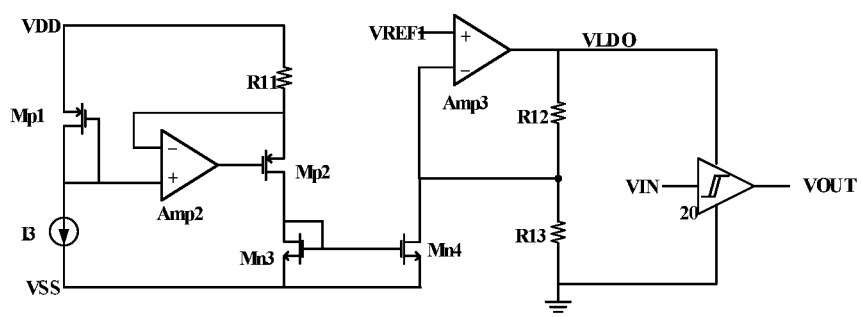
FIG. 6 shows a schematic diagram for a voltage adjustment module according to one embodiment of the present disclosure.

Referring to FIG. 6, it shows a schematic diagram for a voltage adjustment module according to one embodiment of the present disclosure.

In a possible implementation, as shown in FIG. 6, the voltage adjustment module may further include a second operational amplifier Amp2, a third operational amplifier Amp3, a second PMOS Mp2, a third NMOS Mn3, a fourth NMOS Mn4, an eleventh resistor R11, a twelfth resistor R12, a thirteenth resistor R13, and a third current source I3, where:

- a source of the first PMOS Mp1 is electrically connected to a first terminal of the eleventh resistor R11 and configured to receive a supply voltage VDD, and a drain of the first PMOS Mp1 is electrically connected to a positive electrode of the third current source I3, a gate of the first PMOS Mp1, and a positive input of the second operational amplifier Amp2,
- a negative input of the second operational amplifier Amp2 is electrically connected to a second terminal of the eleventh resistor R11 and a source of the second PMOS Mp2, and an output of the second operational amplifier Amp2 is electrically connected to a gate of the second PMOS Mp2,
- a drain of the second PMOS Mp2 is electrically connected to a drain of the third NMOS Mn3, a gate of the third NMOS Mn3, and a gate of the fourth NMOS Mn4,
- a drain of the fourth NMOS Mn4 is electrically connected to a negative input of the third operational amplifier Amp3, a second terminal of the twelfth resistor R12, and a first terminal of the thirteenth resistor R13,
- a positive input of the third operational amplifier Amp3 is configured to receive the input voltage VREF1, and an output of the third operational amplifier Amp3 is electrically connected to a first terminal of the twelfth resistor R12 and the buffer module 20 and configured to output the drive voltage VLDO, and
- all of a negative electrode of the third current source I3, a source of the third NMOS Mn3, a source of the fourth NMOS Mn4, and a second terminal of the thirteenth resistor R13 are grounded.

As shown in FIG. 6, the present embodiments can convert the gate-to-source voltage Vgsp of the first PMOS Mp1 to the current Vgsp/R11 and input the current to the negative input of the third operational amplifier Amp3 and the feedback terminal (between the twelfth resistor R12 and the thirteenth resistor R13) of a voltage dividing resistor string of the VLDO. If the overdrive voltage of the first PMOS Mp1 is Vov4, Vgsp=VTP+Vov4. The voltage VLDO is VREF1*(R12+R13)/R13+(VTP+Vov4)*R12/R11. The present disclosure can adjust the ratio (R12/R11) between the twelfth resistor R12 and the eleventh resistor R11, so as to change the voltage VLDO.

In one example, if it can be set that R12/R11=1, the voltage VLDO is VLDO=VREF1*(R12+R13)/R13+VTP+Vov4. From the equation 1, the following equation can be derived:

$$V_{INV} = \frac{VDD + V_{TN}\sqrt{\frac{1}{r}} - V_{TP}}{1+\sqrt{\frac{1}{r}}} =$$

$$\frac{VREF1^*(R12+R13)/R13 + V_{TN}\sqrt{\frac{1}{r}} + Vov4}{1+\sqrt{\frac{1}{r}}}.$$

Therefore, it can be appreciated from the above equations that $V_{INV}$ is not affected by the supply voltage VDD, but it is related to the input voltage. The input voltage VREF1 may be a reference voltage, so it can remain stable without being affected by the process corner. It can also be appreciated from the above equations that the influence of the threshold voltage $VT_P$ for PMOS is removed, so the variation of the trigger point voltage $V_{INV}$ in the full process corner range is significantly smaller, and the SNFP and FNSP process corners are changed into the SS and FF process corners.

In the low-voltage power supply system, the supply voltage VDD can vary from 2.5V to 5.5V. In order not to increase the cost, a 5V device may be selected for circuit design. In this instance, the technical solution of the present disclosure may be adopted to adjust the received voltage by the adjustment module 10 to obtain the drive voltage VLDO, which can compensate for the variation in the process corners of the threshold voltages for NMOS and PMOS in the buffer module 20, so that the variation of the trigger point voltage $V_{INV}$ in the full process corner range is significantly smaller.

The buffer apparatus proposed in the embodiment of the present disclosure can be adaptively adjusted for the PMOS or MOS with different process corners. In case of the SNFP process corner, the drive voltage VLDO is appropriately lowered by the adjustment module. In case of the FNSP process corner, the drive voltage VLDO is appropriately increased by the adjustment module. By controlling the lowering or increasing amplitude of the drive voltage VLDO, the worst process corner can be improved, such that the SNFP and FNSP process corners are changed into the SS and FF process corners. In this manner, the variation of the trigger point voltage $V_{INV}$ in the full process corner range is significantly smaller.

The foregoing describes only specific embodiments of the present disclosure, but the scope of protection for the present disclosure is not limited thereto. Variations or substitutions within the technical scope disclosed herein that are readily conceivable to a person skilled in the art should all be encompassed in the scope of protection for the present disclosure. Therefore, the scope of protection for the present disclosure shall be subject to that for the claims.

What is claimed is:

1. A buffer apparatus, comprising:
a voltage adjustment module comprising:
a first P-type metal-oxide-semiconductor field effect transistor (PMOS),
a first current source,
a first N-type metal-oxide-semiconductor field-effect transistor (NMOS),
a first resistor,
a second resistor,
a third resistor,
a fourth resistor, and
a first capacitor; and
a buffer module electrically connected to the voltage adjustment module and configured to receive an input signal, and buffer the input signal under the drive voltage to output the buffered signal;
wherein the voltage adjustment module is configured to receive an input voltage and adjust the input voltage with a threshold voltage for the first PMOS to output a drive voltage;
wherein a positive electrode of the first current source is electrically connected to a first terminal of the third resistor to receive the input voltage, and a negative electrode of the first current source is electrically connected to a source of the first PMOS, a gate of the first NMOS, and a first terminal of the first capacitor, wherein the input voltage is a supply voltage;
wherein a gate of the first PMOS is electrically connected to a drain of the first PMOS and a first terminal of the first resistor, and a second terminal of the first resistor is electrically connected to a first terminal of the second resistor;
wherein a second terminal of the third resistor is electrically connected to a drain of the first NMOS;
wherein a source of the first NMOS is electrically connected to a first terminal of the fourth resistor and the buffer module, to output the drive voltage; and
wherein a second terminal of the second resistor, a second terminal of the first capacitor, and a second terminal of the fourth resistor are grounded.

2. The apparatus according to claim 1, wherein the buffer module comprises a third PMOS, a fourth PMOS, a fifth PMOS, a fifth NMOS, a sixth NMOS, a seventh NMOS, and an inverter, wherein,
a source of the third PMOS is electrically connected to a source of the fifth PMOS to input a supply voltage,
a gate of the third PMOS is electrically connected to a gate of the fourth PMOS, a gate of the fifth NMOS, and a gate of the sixth NMOS to receive the input signal,
a drain of the third PMOS is electrically connected to a drain of the fifth PMOS and a source of the fourth PMOS, a drain of the fourth PMOS is electrically connected to an input of the inverter and a drain of the fifth NMOS, a source of the fifth NMOS is electrically connected to a drain of the sixth NMOS and a drain of the seventh NMOS, and a source of the sixth NMOS and a source of the seventh NMOS are grounded, and
an output of the inverter is electrically connected to a gate of the fifth PMOS and a gate of the seventh NMOS to output the buffered signal.

3. The buffer apparatus according to claim 1, wherein the apparatus is applicable to an electronic circuit apparatus including any one of an analog-to-digital conversion circuit, a power-on reset circuit, an ultrasonic sensor circuit, an electronic switching circuit, a signal switching control circuit, an IGBT drive and control circuit, a current threshold detection circuit, a voltage threshold detection circuit, and a photoelectric sensing circuit.

4. A chip, comprising a buffer apparatus, the buffer apparatus comprising:
a voltage adjustment module comprising:
a first P-type metal-oxide-semiconductor field effect transistor (PMOS),
a first current source,
a first N-type metal-oxide-semiconductor field-effect transistor (NMOS),
a first resistor,
a second resistor,
a third resistor,
a fourth resistor, and
a first capacitor; and
a buffer module electrically connected to the voltage adjustment module and configured to receive an input signal, and buffer the input signal under the drive voltage to output the buffered signal;
wherein the voltage adjustment module is configured to receive an input voltage and adjust the input voltage with a threshold voltage for the first PMOS to output a drive voltage;
wherein a positive electrode of the first current source is electrically connected to a first terminal of the third resistor to receive the input voltage, and a negative electrode of the first current source is electrically connected to a source of the first PMOS, a gate of the first NMOS, and a first terminal of the first capacitor, wherein the input voltage is a supply voltage;
wherein a gate of the first PMOS is electrically connected to a drain of the first PMOS and a first terminal of the first resistor, and a second terminal of the first resistor is electrically connected to a first terminal of the second resistor;
wherein a second terminal of the third resistor is electrically connected to a drain of the first NMOS;
wherein a source of the first NMOS is electrically connected to a first terminal of the fourth resistor and the buffer module, to output the drive voltage; and
wherein a second terminal of the second resistor, a second terminal of the first capacitor, and a second terminal of the fourth resistor are grounded.

5. An electronic device, comprising a chip including a buffer apparatus, the buffer apparatus comprising:
a voltage adjustment module comprising:
a first P-type metal-oxide-semiconductor field effect transistor (PMOS),
a first current source,
a first N-type metal-oxide-semiconductor field-effect transistor (NMOS),
a first resistor,
a second resistor,
a third resistor,
a fourth resistor, and
a first capacitor; and
a buffer module electrically connected to the voltage adjustment module and configured to receive an input signal, and buffer the input signal under the drive voltage to output the buffered signal;
wherein the voltage adjustment module is configured to receive an input voltage and adjust the input voltage with a threshold voltage for the first PMOS to output a drive voltage;

wherein a positive electrode of the first current source is electrically connected to a first terminal of the third resistor to receive the input voltage, and a negative electrode of the first current source is electrically connected to a source of the first PMOS, a gate of the first NMOS, and a first terminal of the first capacitor, wherein the input voltage is a supply voltage;

wherein a gate of the first PMOS is electrically connected to a drain of the first PMOS and a first terminal of the first resistor, and a second terminal of the first resistor is electrically connected to a first terminal of the second resistor;

wherein a second terminal of the third resistor is electrically connected to a drain of the first NMOS;

wherein a source of the first NMOS is electrically connected to a first terminal of the fourth resistor and the buffer module, to output the drive voltage; and wherein a second terminal of the second resistor, a second terminal of the first capacitor, and a second terminal of the fourth resistor are grounded.

\* \* \* \* \*